United States Patent [19]
Distefano

[11] Patent Number: 6,075,289
[45] Date of Patent: Jun. 13, 2000

[54] THERMALLY ENHANCED PACKAGED SEMICONDUCTOR ASSEMBLIES

[75] Inventor: Thomas H. Distefano, Monte Sereno, Calif.

[73] Assignee: Tessera, Inc., San Jose, Calif.

[21] Appl. No.: 08/740,856

[22] Filed: Nov. 4, 1996

Related U.S. Application Data

[60] Provisional application No. 60/029,107, Oct. 24, 1996.

[51] Int. Cl.[7] .......................... H01L 23/02; H01L 23/12; H01L 23/28; H05K 5/06
[52] U.S. Cl. ......................... 257/732; 257/704; 257/708; 257/778; 257/699; 257/731; 257/737; 257/707
[58] Field of Search ............................ 257/732, 704, 257/731, 730, 714, 708–710, 675, 712, 778, 733, 734, 738, 737, 699

[56] References Cited

U.S. PATENT DOCUMENTS

| | | |
|---|---|---|
| 3,184,534 | 5/1965 | Jensen . |
| 3,249,826 | 5/1966 | Blackford . |
| 3,538,597 | 11/1970 | Leinkram et al. ...................... 228/164 |
| 3,602,634 | 8/1971 | Meuli ..................... 174/52.3 |
| 3,740,920 | 6/1973 | Lane .......................... 156/60 |
| 4,130,213 | 12/1978 | Wszulek ................... 215/349 |
| 4,323,914 | 4/1982 | Berndlmaier et al. ................... 257/737 |
| 4,350,263 | 9/1982 | Hoffman .................. 220/359 |
| 4,359,852 | 11/1982 | Hoffman et al. ............................ 53/420 |
| 4,611,389 | 9/1986 | Blair et al. ................. 29/827 |
| 4,901,135 | 2/1990 | Costigan .................. 257/710 |
| 5,018,005 | 5/1991 | Lin et al. ................ 257/730 |
| 5,073,521 | 12/1991 | Braden ..................... 29/827 |
| 5,106,758 | 4/1992 | Adler et al. ............... 436/165 |
| 5,139,972 | 8/1992 | Neugebauer et al. .................... 438/113 |
| 5,148,265 | 9/1992 | Khandros et al. ....................... 257/773 |
| 5,148,266 | 9/1992 | Khandros et al. ....................... 257/773 |
| 5,248,901 | 9/1993 | Temple .................... 257/678 |
| 5,311,059 | 5/1994 | Banerji et al. ........................ 257/778 |
| 5,329,160 | 7/1994 | Miura et al. ............................ 257/704 |

(List continued on next page.)

FOREIGN PATENT DOCUMENTS

| | | | |
|---|---|---|---|
| 57-21845 | 2/1982 | Japan | ..................................... 257/778 |
| 63-31384 | 12/1988 | Japan | ..................................... 257/710 |
| 3-108361 | 5/1991 | Japan | ..................................... 257/704 |
| 3-138966 | 6/1991 | Japan | ..................................... 257/704 |
| 3-169052 | 7/1991 | Japan | ..................................... 257/704 |
| 4-87354 | 3/1992 | Japan | ..................................... 257/710 |
| 4-103149 | 4/1992 | Japan | ..................................... 257/710 |
| 4-286145 | 10/1992 | Japan | ..................................... 257/710 |
| 5-95053 | 4/1993 | Japan | ..................................... 252/704 |
| 5-226487 | 9/1993 | Japan | ..................................... 257/778 |
| 6-61368 | 3/1994 | Japan | ..................................... 257/778 |
| 6-151615 | 5/1994 | Japan | ..................................... 257/778 |
| 6-232282 | 8/1994 | Japan | ..................................... 257/778 |
| WO 92/05582 | 4/1992 | WIPO . | |
| WO 94/03036 | 2/1994 | WIPO . | |

OTHER PUBLICATIONS

Azar, K., "Thermal Design Considerations for Multichip Module Applications," pp. 569–613, *Multichip Module Technologies and Alternatives: The Basics,* Edited by Doane and Franzon,© 1993 by Van Nostrand Reinhold.

*Primary Examiner*—Alexander Oscar Williams
*Attorney, Agent, or Firm*—Lerner, David, Littenberg, Krumholz & Mentlik, LLP

[57] ABSTRACT

A thermally enhanced semiconductor package includes a sheet metal cap having flexible flanges provided with solder contacts for reliable attachment to a circuit board. The package assembly further includes a semiconductor chip with a contact-bearing front surface facing forwardly, and chip bonding contacts overlying the front face of the chip. The flange bonding contacts are coplanar with the chip bonding contacts, or can be brought into coplanar alignment by flexure of the cap. The package can be surface-mounted to a circuit board by placing the package onto pads of solder paste, and then heating the assembly to melt the solder paste in order to join the bonding contacts on the chip and on the flange to corresponding contacts on the circuit board.

23 Claims, 2 Drawing Sheets

U.S. PATENT DOCUMENTS

| | | | |
|---|---|---|---|
| 5,375,042 | 12/1994 | Arima et al. | 257/686 |
| 5,408,126 | 4/1995 | Chen | 257/730 |
| 5,446,316 | 8/1995 | Temple et al. | 257/704 |
| 5,468,910 | 11/1995 | Knapp et al. | 174/52.2 |
| 5,475,565 | 12/1995 | Bhattacharyya et al. | 361/719 |
| 5,489,749 | 2/1996 | DiStefano et al. | 361/760 |
| 5,518,964 | 5/1996 | DiStefano et al. | 438/126 |
| 5,572,070 | 11/1996 | Ross | 257/704 |
| 5,611,884 | 3/1997 | Bearinger et al. | 257/778 |
| 5,619,700 | 4/1997 | Kozono | 257/738 |
| 5,629,835 | 5/1997 | Mahuliker et al. | 257/709 |
| 5,639,990 | 6/1997 | Nishihara et al. | 257/709 |
| 5,710,459 | 1/1998 | Teng et al. | 257/738 |
| 5,724,230 | 3/1998 | Poetzinger | 257/709 |
| 5,724,729 | 3/1998 | Sherif et al. | 257/707 |
| 5,747,881 | 5/1998 | Hosomi et al. | 257/762 |
| 5,750,926 | 5/1998 | Schulman et al. | 174/52.3 |
| 5,773,884 | 6/1998 | Andros et al. | 257/737 |
| 5,789,810 | 8/1998 | Gross et al. | 257/710 |
| 5,805,427 | 9/1998 | Hoffman . | |
| 5,808,853 | 9/1998 | Dalal et al. | 257/780 |
| 5,821,166 | 10/1998 | Covell, II et al. | 257/710 |
| 5,889,323 | 3/1999 | Tachibana | 257/704 |

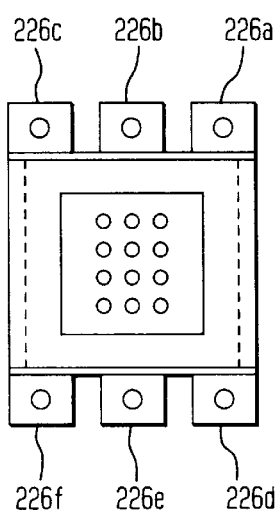
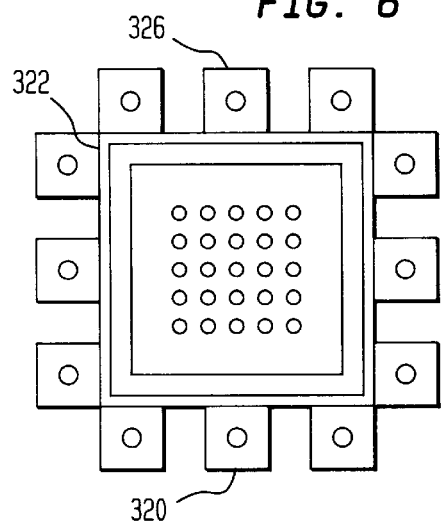
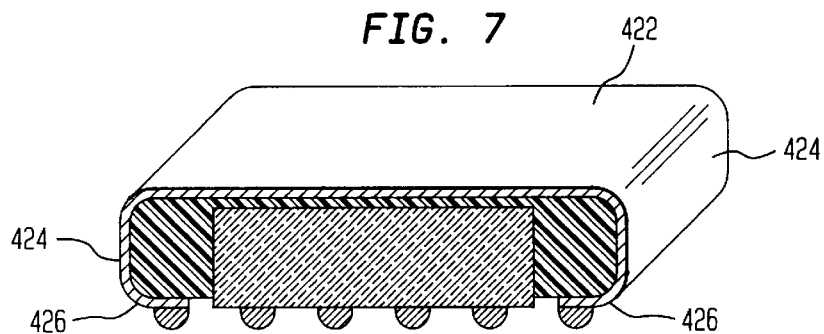
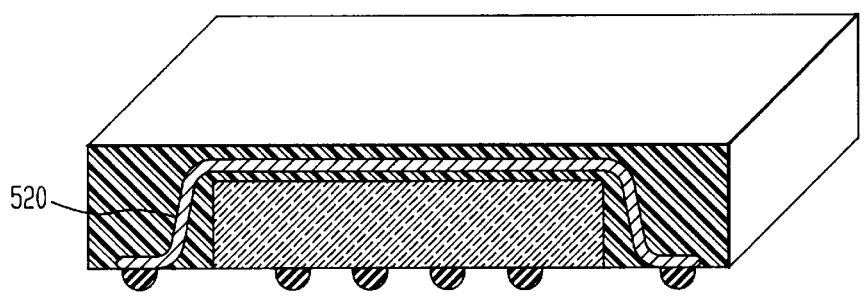
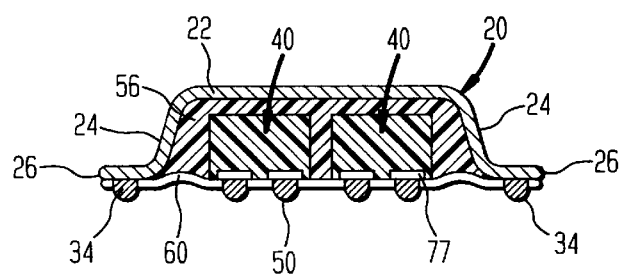

THERMALLY ENHANCED PACKAGED SEMICONDUCTOR ASSEMBLIES

CROSS REFERENCE TO RELATED APPLICATIONS

The present application claims benefit of U.S. Provisional Application Ser. No. 60/029,107, entitled "THERMALLY ENHANCED PACKAGED SEMICONDUCTOR ASSEMBLIES," naming Thomas H. DiStefano as co-inventor, which application was filed on Oct. 24, 1996.

BACKGROUND OF THE INVENTION

The present invention relates to the art of microelectronic packaging and more particularly relates to packaged semiconductor chip assemblies suitable for mounting on substrates such as circuit panels, and to methods of making and using such assemblies.

Semiconductor chips commonly are connected to other elements of an electronic device by mounting the chip on a substrate such as a circuit panel having electrical conductors extending along its surfaces or within the substrate structure. In some cases, the chip is mounted in a package having external conductive elements such as leads or pins protruding from the package. A socket may be mounted to the substrate and the external leads or pins of the chip package may be received in the socket. In other arrangements, the chip package may have solderable contacts on a surface of the package, and may be mounted directly to the substrate by soldering techniques commonly referred to as surface mount technology. In these soldering techniques, each contact on the package directly abuts a contact pad on the substrate, and is bonded thereto by solder masses carried on the package or on the substrate. In other techniques, a bare unpackaged chip can be placed directly on the circuit panel and connected to the electrical conductors of the panel by techniques such as wire bonding, tape automated bonding (TAB), or flip-chip bonding. In flip-chip bonding, the front surface of the chip faces downwardly toward the surface of the substrate, and contacts on the front surface of the chip are directly bonded to contact pads on the substrate surface, as by solder disposed between the contacts and pads. The entire assembly is then packaged, as by encapsulating or partially encapsulating the substrate and chip.

In many cases, it is desirable to provide a metal cap covering the chip, the chip being bonded to the substrate. Such a cap can serve as a thermal spreader, and can conduct heat generated by the chip during operation away from the chip. For example, in a flip chip arrangement, the cap may provide a thermal path from a rear surface of the chip, facing away from the panel, to the circuit panel. The metal cap may also provide an electrical interconnection to the rear surface, as where the rear surface is used as a ground or power connection. Also, the cap can provide additional mechanical protection and additional electrical shielding around the chip. Typically, such caps have been added in separate operations after the chip is mounted on a circuit panel, which have required additional steps beyond those needed to mount the chip. Moreover, the metal caps and other components used in attaching the metal caps to the chips and circuit panels must be stocked and handled separately. All of this adds cost and complexity to the circuit panel manufacturing process. Accordingly, there have been needs prior to the present invention for improved chip assembly procedures which avoid the need for separate handling of the metal cap during assembly of the circuit panel, and there have been corresponding needs for prepackaged chip assemblies which can be utilized in such simplified procedures, as well as needs for methods of making such chip assemblies.

SUMMARY OF THE INVENTION

The present invention addresses these needs.

One aspect of the present invention provides a packaged semiconductor chip assembly for mounting on a substrate. The assembly according to this aspect of the invention includes a metallic cap defining a rear wall, at least one side wall projecting forwardly from the rear wall and at least one flange projecting from the side wall at a forward edge thereof remote from the rear wall. At least part of the cap is flexible so that the flange or flanges is or are movable with respect to the rear wall. Most preferably, the metallic cap is formed from a unitary piece of bent sheet metal. The assembly further includes one or more semiconductor chips. Each chip has a rear surface bonded to the rear wall of the cap and a front surface facing forwardly away from the rear wall. Most preferably, the rear wall of the cap is rectangular, and has side walls and flanges on two opposed sides or on four sides, so that the rear wall and side walls cooperatively define a u-shaped or box-shaped enclosure and the chip or chips are received in this enclosure.

The assembly further includes chip bonding contacts overlying the front surface of each chip and electrically connected to the chip. The chip bonding contacts may be provided on the front surface of the chip itself, or else may be provided on an interposer, such as a flexible, sheet-like dielectric element overlying the front surface of the chip. The flange or flanges also have bonding contacts thereon. The chip bonding contacts and the flange bonding contacts may be metallic contacts adapted for bonding to metallic contacts on the substrate. Most preferably, the chip bonding contacts and the flange bonding contacts are solderable contacts. The flange bonding contacts may be formed as portions of the flange itself, i.e., as exposed solderable metal areas on the flange surface adapted to be wet by the solder. The chip bonding contacts and flange bonding contacts may also include solder masses. Some or all of the solder masses may be solid core solder balls, incorporating cores of high-melting materials.

Preferably, the flange bonding contacts are coplanar with the chip bonding contacts in at least one position of the flange or flanges. Thus, when the metallic cap is in an undeformed condition, the flange bonding contacts may be exactly coplanar with the chip bonding contacts, or else may stand slightly forward or slightly rearwardly of the chip bonding contacts. However, any deviation from precise coplanarity in the undeformed condition desirably is minor, so that the flange bonding contacts and chip bonding contacts can be made coplanar during the assembly process as discussed below by minor deformation of the cap. Most preferably, the assembly includes a flexible potting compound surrounding the chip but not coating the contacts.

In a mounting procedure according to a further aspect of the present invention, an assembly such as the assemblies discussed above is engaged with a face of a substrate so that both the flange contacts and the chip contacts engage the substrate. The method further includes the step of bonding the flange contacts and the chip contacts to the substrate. Most preferably, the bonding step is performed so as to bond the flange contacts and chip contacts to the substrate simultaneously, as by providing molten solder at the interface between the flange contacts and the substrate and at the interface between the chip contacts and the substrate and cooling the assembly to resolidify the solder while maintaining the flange contacts and the chip contacts in engagement with the substrate. The molten solder may be provided by melting solder in masses of solder provided either on the substrate or on the contacts. The substrate may be a conventional, generally planar substrate such as a circuit board or other circuit panel.

The packaged chip subassembly can be handled as a unit, using substantially the same techniques as are common in conventional surface mounting operations. The same operations used to mount the chip itself also serve to mount the metallic cap and to form the interconnections needed for thermal and/or electrical interconnection of the cap with the substrate. The entire packaged chip assembly can be stocked, handled and placed as a unit. Moreover, the cap provides some mechanical protection to the chip both before and after mounting the assembly to the circuit panel.

The flexibility of the cap allows the cap to accommodate thermally generated stresses during mounting as further discussed below and also allows the cap to compensate for thermal expansion and contraction of the components during use.

A further aspect of the present invention provides methods for making chip assemblies such as those discussed above. The preferred method according to this aspect of the present invention includes the step of providing a metallic element having one or more rear regions and one or more flange regions offset from the rear regions in a forward direction. A plurality of semiconductor chips are placed into the one or more rear regions in front face forward disposition so that the rear face of each chip overlies a rear region of the metallic element and so that the front face of the chip faces away from the metallic element. The rear face of each chip is attached to a rear region of the metallic element, as by a thermally conductive adhesive disposed between the rear face of the chip and the rear region. Bondable flange contacts are provided on the flange regions of the metallic element, whereas bondable chip contacts are provided overlying the front face of each chip. After the placing and attaching steps, the metallic element is severed to form a plurality of chip package assemblies. Each assembly includes a metallic cap having a rear wall, having one or more flanges with flange contacts thereon. Each assembly also includes at least one chip attached to the rear wall of the cap and chip contacts overlying the face of each such chip. The step of providing chip contacts and flange contacts may include the step of placing solder masses on the chip and on the flange. Also, the method may include the step of providing a flexible potting compound surrounding the chips before the severing step, so that the potting compound does not cover the contacts of the finished assemblies. This process provides an economical method of manufacturing the chip assemblies.

BRIEF DESCRIPTION OF THE DRAWINGS

FIG. 5 is a view similar to FIG. 1 but depicting an assembly in accordance with yet another embodiment of the invention.

FIG. 6 is a view similar to FIGS. 1 and 5 but depicting an assembly in accordance with a further embodiment of the invention.

FIG. 7 is a diagrammatic sectional view depicting an assembly in accordance with yet another embodiment of the invention.

FIG. 8 is a further diagrammatic sectional view depicting an assembly in accordance with yet another embodiment of the invention.

FIG. 9 is a further diagrammatic sectional view depicting an assembly in accordance with yet another embodiment of the invention.

DETAILED DESCRIPTION OF THE PREFERRED EMBODIMENTS

Figure 2:
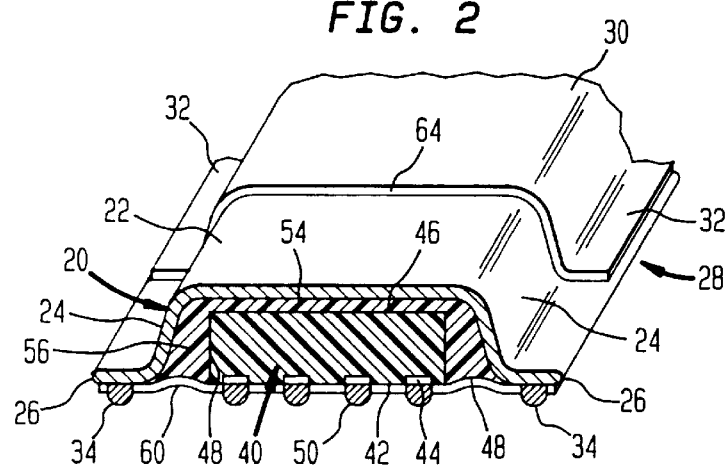
FIG. 2 is a diagrammatic, partially sectional perspective view depicting the chip assembly of FIG. 1 during manufacture.

An assembly in accordance with one embodiment of the present invention incorporates a metallic cap 20 formed from a unitary piece of bent sheet metal defining a generally U-shaped enclosure. Thus, cap 20 includes a rear wall 22, a pair of opposed side walls 24 projecting forwardly from rear wall 22 and a pair of flanges 26 projecting outwardly from flanges 24 at the forward edges thereof, remote from rear wall 22. Cap 20 may be formed from essentially any metal having acceptable thermal conductivity. Metals such as copper, copper alloys, aluminum and aluminum alloys are preferred for reasons of cost and thermal conductivity. The thickness of the cap will depend upon the size of the assembly and the degree of flexibility or spring constant desired. For typical assemblies arranged to accommodate a single chip of conventional size, with length and width of a few cm, the sheet metal forming the cap desirably is between about 0.10 mm and 0.30 mm thick. As indicated in FIG. 2, cap 20 can be fabricated as part of an elongated, generally U-shaped channel 28 having a central, rear region 30 and a pair of forwardly-positioned flange regions 32 extending along the length of the channel, the flange regions 32 being connected to the rear region 30 by side wall regions. As further discussed below, elongated channel 28 is severed after assembly of the other components to form individual caps 20.

Figure 3:
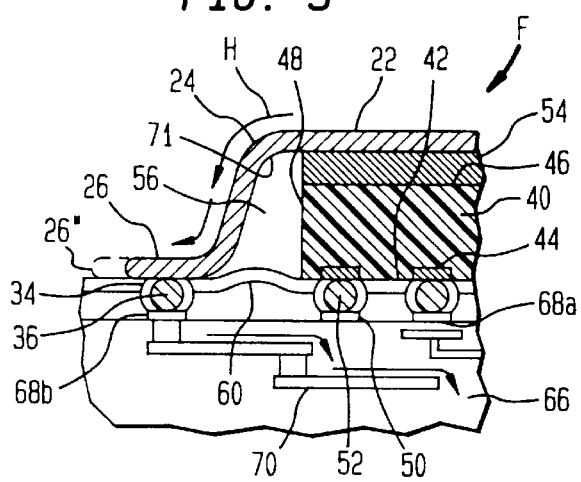
FIG. 3 is a fragmentary sectional view on an enlarged scale depicting the chip assembly of FIG. 2 in conjunction with a substrate.

The flanges 26 of each cap are provided with flange bonding terminals including solder masses 34. As best seen in FIG. 3, each such solder mass includes a core 36 formed from a metal such as copper or copper based alloys having a melting temperature substantially above the melting temperature of the solder. Core 36 may be in the form of a wire or rod extending along the elongated mass 34 (FIG. 1) on each surface 26. Alternatively, the unitary mass 34 depicted in FIGS. 1–3 may be replaced by a plurality of individual, spherical solders balls, each having an individual spherical core. Each bonding terminal also includes the region of flange 26 underlying the solder mass 34. Each such region of the flange surface is metallurgically bonded to the solder. Thus, during placement of the solder masses 34 or the flanges, the solder masses may be momentarily melted so as to cause the solder to wet the surfaces of flanges 26 in the areas of the flange constituting the bonding terminals. Thus, the area of the front surface of flange 26 immediately contacting each solder mass 34 serves as a solderable metallic base contact, capable of being wet by the solder.

Each assembly further includes a semiconductor chip 40 having a front surface 42 with individual metallic base contacts 44 thereon. Metallic base contacts 44 may be formed from conventional metals deposited as part of the semiconductor chip during the normal fabrication process. Base contacts 44 are electrically connected to internal electronic circuitry within the chip (not shown) in the conventional manner. Base contacts 44 include conventional solderable metals, such as copper and nickel, with a thin protective coating of gold, palladium, Enthone (from Enthone Corp.) or other protective film. Each chip 40 also has a rear surface 46 facing oppositely, away from front surface 42 and edge surfaces 48 extending between the front and rear surfaces. Each base contact 44 on the front surface 42 of the chip has a mass of solder 50 in the form of a generally spherical ball. Each such mass has a spherical core 52 formed from a relatively high-melting metal such as copper or a copper alloy.

The chip 40 of each assembly is mounted in the space between the opposed side walls 24 of the cap. The rear surface 46 of the chip is bonded to the rear wall 22 of the cap by a layer of a thermally conductive and electrically conductive adhesive 54. Adhesive 54 may include conventional conductive adhesives of the type used for mounting chips and for mounting heat sinks to chips in the semiconductor industry. For example, adhesive 54 may comprise a polymeric material loaded with fine particles of metals such as gold or silver to enhance both thermal and electrical conductivity, available from Ablestick, Inc. Adhesive 54 enhances heat transfer between chip 40 and back wall 22, and also provides an electrical interconnection between the back wall of the cap and a ground terminal (not shown) on the rear surface of the chip.

The assembly further includes a soft, flexible dielectric potting compound 56 disposed within cap 20 and substantially surrounding chip 40 and filling the space within the cap not occupied by the chip. Thus, potting compound 56 fills the spaces between the edge walls 48 of the chip and the side walls 24 of the cap. Potting compound 56 also extends between the side walls 48 of the chip and the open ends 58 of the cap. However, potting compound 56 does not cover the bonding contacts on the flanges 26 or on the chip front surface 42. Thus, the potting compound does not cover solder masses 34 and 50. The potting compound may be a gel, an elastomer or other soft, flexible material. The potting compound desirably has a tensile modulus of elasticity or young's modulus less than 100,000 pounds per square inch (less than 670 megaPascals) and most desirably between about 100 pounds per square inch and about 10,000 pounds per square inch (between 0.67 and 67 megaPascals). The potting compound preferably has a hardness below about 60 on the Shore D durometer scale, more preferably between about Shore A 20 and about Shore D 60 and most preferably between about Shore A 20 and about Shore A 90. Many conventional soft potting compounds utilized in the semiconductor industry can be employed. For example, gels, elastomers, soft epoxies and the like may be used. A silicone gel of the type sold under the designation 577 by the Dow Corning Corporation of Midland, Mich. may be used.

The assembly may further include a thin, flexible mask layer 60 covering the exposed surfaces of flanges 26, potting compound 56, and chip front surface 42, leaving the bonding contacts, such as solder masses 34 and 50 exposed. The flexible layer may be made from polymeric films as are commonly employed as solder masks in the semiconductor industry, such as Pyrelux 2000 made by the DuPont Corporation.

Assemblies as discussed above with reference to FIGS. 1–3 may be fabricated by placing a plurality of chips within the rear region 30 of the elongated U-shaped channel 28, and bonding all of the plural chips to the channel. After the chips have been bonded in the channel, flexible solder mask layer 60 is applied, bridging across the spaces between the edge walls of the chip and the flange regions of the channel. A curable liquid is then filled into the channel, so that the curable liquid fills the spaces around the chips. Solder mask layer 60 prevents flow of the curable liquid out onto the flange surfaces and onto the chip front surface, thereby protecting the bonding contacts from the curable liquid. The solder masses 34 and 50 may be applied before or after filling and curing the potting compound. After the solder masses have been applied, elongated channel 28 is severed, as by shearing or sawing it at cut lines 64 between chips, thereby separating an individual package assembly including an individual cap 20 and a chip 40 from the elongated channel. The severing action also cuts the potting compound. The severing action is repeated to sever additional assemblies from the channel. Alternatively, multiple assemblies may be severed simultaneously using a die which makes cuts at several lines simultaneously.

The individual assemblies may be handled and stocked in substantially the same manner as other parts adapted for surface mounting. In each assembly, the chip 40 is protected by the surrounding cap 20 and potting compound 56. In a mounting method according to a further embodiment of the invention, an individual assembly is assembled to a substrate such as a circuit board or other circuit panel 66 (FIG. 3) by aligning the bonding contacts on the chip, including solder masses 50 with contact pads 68a of the circuit panel while also aligning the flange bonding contacts including solder masses 34 with further contact pads 68b of the substrate or panel. Such alignment can be achieved, for example, by conventional surface mount pick and place systems such as the Fuji IV system available from Fuji, Ltd. of Japan using conventional techniques used for aligning surface mount components with contact pads for surface mounting. Typically, the contact pads 68a and 68b on the panel are coated with a paste including a flux and a solder. While maintaining assembly in alignment with the panel, the assembly is advanced forwardly until the solder masses 34 and 50 on the assembly engage the contact pads on the panel. The assembly is retained in place by adhesion of the solder masses and the paste. Typically, numerous parts are engaged with the panel. After all of the parts have been engaged with the panel, the panel is advanced into an oven where the assembly and panel are heated so as to liquefy or partially liquefy the solder, solder paste and masses 34 and 50 and then cooled. This solder reflow process simultaneously forms a solid, metallurgical solder bond between the chip and contact pads 68a of the substrate and forms a solid, metal-to-metal bond between flanges 26 of the cap and contact pads 68b of the substrate. Thus, in a standard surface mount operation consisting of engaging the package assembly, placing it onto pads with solder paste, heating it to melt the solder and cooling it, both the chip and the cap have been securely mounted to the circuit panel.

In an alternative process, the assembly is held in place by a force F applied to rear surface 22 during heating and reflow. For example, the assembly may be held in a chuck which grasps cap 20 and preferably engages the cap at the rear wall 22, and the chuck may be advanced towards the substrate 66. Prior to contact with the substrate or circuit panel, the flange bonding contacts, including solder masses 34, may be disposed slightly forwardly of the chip bonding contacts including solder masses 50. For example, the flange bonding contacts or solder masses 34 may be disposed in the positions schematically depicted at 34' in FIG. 3. However, as the assembly is advanced towards the substrate, side walls 24 of the cap can flex. Flexure may also occur in the flanges 26 themselves, and in the curved portions of the metallic sheet where side walls 24 meet rear wall 24 and flanges 26. The net effect is to allow flanges 26, and the flange bonding contacts, including solder masses 34, to move rearwardly with respect to the other elements of the assembly and with respect to chip 40, thereby bringing the flange bonding contacts into substantially coplanar alignment with the chip bonding contacts including solder masses 50. Thus, the solder masses 34 of the flange bonding contact and the solder masses 50 of the chip bonding contacts, can all be engaged with pads of solder paste on the corresponding contact pads 68 of the circuit panel or substrate and retained in engagement during reflow.

In the assembled condition, flanges 26 can move freely along with contact pads 68b. Thus, flange 26 can flex appreciably from the position which it occupies after bonding, toward the position shown at 26" in FIG. 3. Such movement allows for differential thermal expansion of the cap with respect to the other components and also allows for differential thermal expansion of the circuit panel with respect to the chip. Because the cap is flexible, movement of the flanges 26 with respect to the chip, as may be caused by movement of contact pad 68b with respect to contact pad 68a due to thermal expansion does not impose substantial loads on the solder joints. The same effect relieves thermal stresses encountered during the soldering operation. Likewise, warpage or distortion of the parts out of planarity does not impose substantial loads through the cap; the cap simply flexes to accommodate such movement. Flexibility of the cap also allows for deviations from precise planarity in the parts during the assembly process. For example, if the substrate is out of plane, the flange contacts can be displaced relative to the chip contacts, so that both sets of contacts can be engaged simultaneously with contact pads on the substrate. Further, flexibility of cap 22 allows chip 40 to tilt slightly and accommodate bending of the substrate.

Cap 20 is effectively linked in both thermal and electrical communication with substrate 66. Through flanges 26 and flange contacts 34, the cap is effectively linked to internal conductors 70 within the substrate. These internal conductors may carry a ground or power potential. Such potential is applied throughout the entire cap, so that the cap serves as an electrical shield around the chip. Moreover, heat produced in the chip during operation is conducted through the cap of the flanges, in the direction indicated by arrows H in FIG. 3. This heat is conducted into the substrate and away from the chip. In further configurations (not shown) cap 20 may be provided with fins, pins or other devices for dissipating heat directly from the cap into the surrounding environment as well. Thus, the direction of heat flow may be reversed, and the cap can dissipate heat from the substrate.

Figure 1:
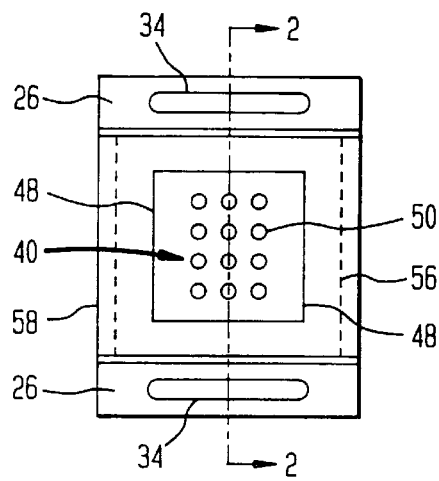
FIG. 1 is a diagrammatic bottom view of a packaged semiconductor chip assembly in accordance with one embodiment of the invention.
Figure 4:
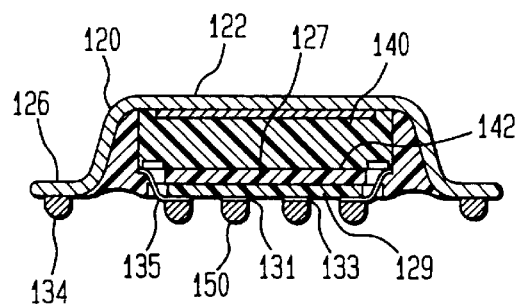
FIG. 4 is a diagrammatic sectional view depicting an assembly in accordance with a further embodiment of the invention.

The assembly depicted in FIG. 4 is substantially similar to that depicted in FIGS. 1–3, except that chip bonding contacts 133 are not provided directly on the front face 142 of chip 140. Instead, a flexible dielectric sheet 129 overlies chip front surface 142. A compliant layer 127 is disposed between sheet 129 and chip front surface 142. Metallic base contacts or terminals 131 are carried on sheet 129 and connected to chip 142 by flexible leads 135. The assembly of terminals or base contacts 131, sheet 129; compliant layer 127 and chip 140 may be as taught, for example, in U.S. Pat. Nos. 5,148,266; 5,148,265; 5,158,964 or 5,489,749, as well as in PCT International published patent application WO 94/03036 and WO 92/05582, all of which are assigned to the assignee of the present invention. The disclosures of such patents and published applications are hereby incorporated by reference herein. As further disclosed in these patents and publications, the terminals or base contacts 131 are free to move relative to chip 140. The chip contacts may further include solder masses 150 disposed on the base contacts or terminals 131. In other respects, the assembly may be similar to that discussed above. Thus, the cap 120 at least partially encloses the chip and is provided with bonding contacts 134 on flanges 126 of the cap. Here again, the cap is flexible so that the flanges are free to move relative to the rear surface 122 of the cap and hence relative to the chip 140. During the mounting procedure, movability of the flanges with respect to the chip once again takes up tolerances in the assembly. Moreover, because each of the chip contacts is movable relative to the chip, problems of non-copolanarity of the chip and substrate are alleviated still further. For example, if the chip is tilted slightly out of the plane, or if the substrate is slightly non-planar, each chip bonding contact or terminal 131 can be displaced slightly in directions towards and away from the front surface of the chip. Also, during operation differential thermal expansion of the chip and substrate can cause some portions of the chip to move relative to some portions of the substrate. Movability of the chip bonding contacts or terminals 131 relative to the chip allows for such relative movement. This is particularly important in the case of large chips which dissipate substantial amounts of heat during operation.

The assembly illustrated in FIG. 5 is similar to that discussed above with reference to FIGS. 1–3, except that the flanges 226 of the cap are subdivided into individual small tabs 226a, 226b, 226c, 226d, 226e and 226f These individual small tabs are even more flexible than the single large flange depicted in FIG. 1.

In the assembly of FIG. 6, the cap has flanges 326 disposed on all four sides of the rectangular rear wall 322 and side walls projecting forwardly from all edges of the rear wall to the flanges. Here again, the flanges are subdivided into individual small tabs. The caps in this configuration may be provided in a large, sheetlike rectalinear array including numerous caps disclosed in columns and rows rather than in the linear array or elongated channel 28 (FIG. 2). Once again, after assembly of the other components to the cap, the cap array is severed so as to leave individual assemblies.

The assembly partially depicted in FIG. 7 is similar to that discussed above with reference to FIGS. 1–3 except that the flanges 426 project inwardly from side walls 424, so that each flange overlies a small portion of rear surface 422 adjacent the margins thereof.

Yet another embodiment depicted in FIG. 8 has potting compound disposed both inside and outside of the cap 520. The potting compound disposed outside the cap may have the same composition as that disposed within the cap, or else may be a different composition.

As will be readily appreciated, numerous variations and combinations of the features discussed above can be utilized without departing from the present invention as defined by the claims. For example, the adhesive 54 need not be electrically conductive. Also, the solid cores in the solder masses may be omitted in some or all of the solder masses. Similarly, the solder mask layer 60 and similar layers in other embodiments may be omitted. Each chip assembly may incorporate more than one chip disposed in the same cap. Moreover, the chip bonding contacts and flange bonding contacts of the chip assembly need not incorporate solder. Thus, the solder used in the bonding process may be provided only as solder balls and/or solder paste on the substrate rather than on the assembly. Alternatively, metallic bonding materials other than solder, such as diffusion bonding alloys, eutectic bonding alloys and the like may be employed in place of solder. These bonding materials as well may be carried on the substrate or on the assembly provided that the contacts of the assembly are adapted for bonding with these materials.

As these and other variations and combinations of the features discussed above can be utilized, the foregoing description should be taken by way of illustration rather than by way of limitation of the invention defined by the claims.

What is claimed is:

1. A packaged semiconductor chip assembly for mounting on a substrate, said assembly comprising:

(a) a metallic cap defining a rear wall, at least one side wall projecting forwardly from the rear wall and at least one flange projecting from said at least one side wall at a forward edge thereof remote from the rear wall, at least part of said cap being flexible so that said at least one flange is movable with respect to said rear wall;

(b) a semiconductor chip mounted to said cap, said chip having a rear surface bonded to said rear wall and a front surface facing away from said rear wall;

(c) chip bonding contacts overlying said front surface of said chip and electrically connected to circuits on said chip; and (d) flange bonding contacts on said at least one flange, said flange bonding contacts being coplanar with said chip bonding contacts in at least one position of said at least one flange, whereby said chip bonding contacts and said flange bonding contacts can be bonded simultaneously to a planar substrate to thereby electrically connect the chip to the substrate and mechanically and thermally connect the cap to the substrate.

2. An assembly as claimed in claim 1 wherein said flange bonding contacts and said chip bonding contacts are metallic for bonding by metallic bonding materials.

3. An assembly as claimed in claim 1 wherein said chip bonding contacts and said flange bonding contacts are solderable.

4. An assembly as claimed in claim 3 wherein said chip bonding contacts and said flange bonding contacts include metallic base contacts and solder on said metallic base contacts.

5. An assembly as claimed in claim 4 wherein at least some of said contacts include cores with a melting temperature above the melting temperature of the solder disposed in the solder.

6. An assembly as claimed in claim 5 wherein said flange contacts have said cores and said chip contacts do not have said cores.

7. An assembly as claimed in claim 5 wherein said chip contacts have said cores and said flange contacts do not have cores.

8. An assembly as claimed in claim 1 or claim 5 or claim 6 wherein, when said cap is in an undeformed condition, said flange contacts are disposed forwardly of said chip contacts, and wherein said flange contacts can be brought into coplanar disposition with said chip contacts by engaging the flange contacts with a planar substrate and urging the rear wall of the cap forwardly to thereby move the chip and the chip contacts toward the planar substrate.

9. An assembly as claimed in claim 1 wherein said chip bonding contacts are disposed on the front surface of said chip.

10. An assembly as claimed in claim 1 further comprising a dielectric interposer overlying said front surface of said chip, said chip bonding contacts being disposed on said interposer.

11. An assembly as claimed in claim 1 wherein said chip bonding contacts are movable with respect to said chip.

12. An assembly as claimed in claim 1 further comprising a flexible potting compound at least partially surrounding said chip but not covering said contacts.

13. An assembly as claimed in claim 12 wherein said potting compound has a hardness of less than Shore D 60.

14. An assembly as claimed in claim 13 wherein said potting compound has a hardness of less than Shore A90.

15. An assembly as claimed in claim 1 wherein said potting compound has an elastic modulus less than 100,000 pounds per square inch.

16. An assembly as claimed in claim 1 wherein said rear surface is bonded to said rear wall by means of a thermally conductive but electrically insulating material.

17. An assembly as claimed in claim 1 wherein said rear surface is bonded to said rear wall by means of a thermally conductive and electrically conductive material.

18. An assembly as claimed in claim 1 wherein said cap is formed from a unitary piece of sheet metal.

19. An assembly as claimed in claim 1 wherein each said side wall is flexible.

20. An assembly as claimed in claim 1 wherein said at least one side wall includes a first pair of side walls extending from opposite edges of said rear wall, said chip being disposed between said first pair of side walls.

21. An assembly as claimed in claim 1 wherein said rear wall is rectangular, and wherein said at least one side wall includes four side walls extending from four edges of said rectangular rear wall, said chip being disposed between said four side walls.

22. An assembly as claimed in claim 1 including a plurality of chips mounted to said cap, each said chip having a front surface facing away from said rear wall, said chip bonding contacts overlying said front surfaces of said plural chips and being connected to said plural chips.

23. An assembly as claimed in claim 1, wherein said planar substrate includes at least one internal conductor connected to a contact pad on the surface of said substrate which is in electrical communication with at least one of said flange bonding contacts.

* * * * *